United States Patent [19]
Grünwald et al.

[11] Patent Number: 6,126,792
[45] Date of Patent: Oct. 3, 2000

[54] METHOD FOR THE APPLICATION OF A SCRATCH PROTECTION LAYER AND AN ANTIREFLECTION COATING SYSTEM AND APPARATUS FOR ITS EXECUTION

[75] Inventors: Heinrich Grünwald, Niddatal; Michael Liehr, Feldatal, both of Germany

[73] Assignee: Leybold Systems GmbH, Hanau, Germany

[21] Appl. No.: 09/363,850

[22] Filed: Jul. 30, 1999

[30] Foreign Application Priority Data

Jul. 30, 1998 [DE] Germany .......................... 198 34 314

[51] Int. Cl.[7] ........................... C23C 16/44; C23C 17/34
[52] U.S. Cl. .................................. 204/192.14; 204/192.1; 204/192.12; 204/192.15; 204/192.16; 204/192.26; 204/192.28; 204/298.02; 204/298.06; 204/298.07; 204/298.12; 204/298.23; 204/298.25; 204/298.26; 204/298.28; 118/723 E; 118/723 R; 118/723 ER; 118/729; 118/730; 118/75; 427/569; 427/585; 427/590
[58] Field of Search ........................... 204/192.1, 192.12, 204/192.14, 192.15, 192.16, 192.26, 192.28, 298.02, 298.06, 298.07, 298.12, 298.23, 298.25, 298.26, 298.28; 118/723 E, 723 R, 723 ER, 729, 730, 75; 427/569, 585, 590

[56] References Cited

U.S. PATENT DOCUMENTS 4,234,622  11/1980  DuBuske et al. ................... 204/198.26
5,330,633   7/1994  Matsumoto et al. ................ 204/298.25
5,466,296  11/1995  Misiano et al. .................... 204/298.26

FOREIGN PATENT DOCUMENTS

| 4335244 | 4/1995 | Germany . |
| 4414083 | 10/1995 | Germany . |
| 4422472 | 1/1996 | Germany . |
| 62-174382 | 7/1987 | Japan . |
| WO 95/25828 | 9/1995 | WIPO . |
| WO 98/10114 | 3/1998 | WIPO . |

OTHER PUBLICATIONS

IBM Technical Disclosure Bulletin, "Thin Films Deposition System," vol. 38, No. 2, pp. 187–188.

JP 62-174382, Patent Abstracts of Japan, C–470, Jan. 22, 1988, vol. 12, No. 22.

*Primary Examiner*—Alan Diamond
*Attorney, Agent, or Firm*—Smith, Gambrell & Russell, LLP

[57] ABSTRACT

For the application of a scratch protection layer on plastic substrates, a plasma is produced by the plasma CVD method, away from the individual plastic substrate, in an excitation gas, and this excitation gas is supplied through a tube to the plastic substrate. Subsequently, an antireflection layer is applied by means of a gas flow sputter source. The apparatus provided for this has a plasma CVD chamber (1) and a gas flow sputter chamber (2), next to one another. The plastic substrates (7,8) to be coated are transported from the plasma CVD chamber (2) to the gas flow sputter chamber (1) with the aid of a transporting device (3), designed as a turning plate.

5 Claims, 1 Drawing Sheet

METHOD FOR THE APPLICATION OF A SCRATCH PROTECTION LAYER AND AN ANTIREFLECTION COATING SYSTEM AND APPARATUS FOR ITS EXECUTION

INTRODUCTION AND BACKGROUND

The present invention relates to a method for the application of a scratch protection layer and an antireflection coating system on plastic substrates, in particular, eyeglasses, in that a plasma is produced for the formation of the scratch protection layer, by the plasma CVD method, away from the pertinent plastic substrate, in an excitation gas, and this excitation gas is supplied to the plastic substrate through a tube and a structure-forming gas is introduced, simultaneously, into the vacuum chamber. Furthermore, the invention concerns an apparatus to carry out this method.

An important purpose for such a method is the coating of eyeglasses made of plastic. Such eyeglass are made, for example, of a polycarbonate. Like other plastic substrates, they should not be excessively heated during the coating. Therefore, coating by means of sputtering is problematic and can be used only for the application of relatively thin layers because with longer sputtering processes, the thermal stress of the eyeglasses is too large if expensive cooling of the substrate is not provided.

In order to provide plastic substrates with a relatively thick scratch protection layer, without undesired strong heating of the substrates, a plasma CVD method has been developed in which the plasma is formed, away from the substrate, in an excitation gas, and this excitation gas is supplied to the substrate by a tube in a vacuum chamber, and in which a structure-forming gas is introduced into the vacuum chamber. Such a method is described, for example, in German patent 44 14 083.

Various layers can be applied very economically on a substrate by means of sputtering. As EP 0 699 246 shows, a method is also already known for optical lenses, in which the optical lenses are supplied, one after another, in a passage through several sputtering chambers, and there a layer is applied on the individual lens by sputtering. The thermal stress of the substrates, however, is mostly excessively high with the traditional sputtering for plastic substrates.

A gas flow sputter method for the production of aluminum oxide layers can be found in the journal entitled: *Surface and Coatings Technology*, 59 (1993), 171–176, in which a sputter electrode with two targets opposite one another is provided, between which a gas flows and subsequently arrives at the substrate. This reference puts particular emphasis on the fact that the thermal stress of the substrate is particularly low with this method.

It is therefore an object of the invention to be able to provide a scratch protection layer and an antireflection coating system that can be carried out so that the treatment can be applied immediately one after another, without an inadmissibly high thermal stress of the plastic substrates occurring.

It is a further object of the present invention to provide an apparatus to carry out this method.

SUMMARY OF THE INVENTION

The above and other objects of the present invention can be achieved by using gas flow sputter source for the production of the high-refraction layer or the high-refraction layers of the antireflection coating system.

By using an apparatus for the application of a scratch protection layer, designated mostly as a downstream plasma source, and the subsequent use of a gas flow sputter source for the antireflection coatings or for a high-refraction layer, the thermal stress of the plastic substrate is kept low in both method stages. Therefore, it was possible to pass the plastic substrates through even several sputter chambers, each of which has a gas flow sputter source, in order to apply, alternately, low-refraction and high-refraction layers. However, it is also possible to produce the low-refraction layers in the plasma CVD chamber.

The apparatus required for the execution of the method in accordance with the invention is particularly economical if the plasma CVD method and the sputtering are carried out in a single vacuum chamber, in that two sputter electrodes, opposite one another, forming two tube areas, are used as the sputter source, within which the source supplying the excitation gas, such as a tube, is moved from a position exposing the sputter electrodes during the sputtering in the plasma CVD method, so as to protect the sputter electrodes from a contamination during the plasma CVD method.

The second feature of the invention, namely the creation of an apparatus to carry out the method of the invention, is solved according to the teachings herein by the apparatus being equipped with a plasma CVD chamber and a gas flow sputter chamber, separate from one another, and a transporting device to transport the plastic substrate from the plasma CVD chamber to the gas flow sputter chamber.

Such an apparatus can be designed in a particularly simple manner if the transporting device is a turning plate. This turning plate can form, at the same time, a lower closure mechanism for the two chambers and in this way seal them off.

Instead of providing two separate vacuum chambers, another embodiment is possible, according to which the apparatus has a single vacuum chamber in which two sputter electrodes, forming two tube areas, are arranged opposite one another and into which the tube for the excitation gas of the plasma CVD method leads coaxially to the sputter electrodes. According to this, the tube, which can move axially from a position covering the inside jacket surface of the sputter electrodes, is arranged so that it can move into a position exposing the electrodes.

BRIEF DESCRIPTION OF THE DRAWINGS

The invention permits various embodiments. For a further illustration of this basic principle, two embodiments are depicted schematically in the accompanying drawings. The figures show the following.

DETAILED DESCRIPTION OF INVENTION

Figure 1:
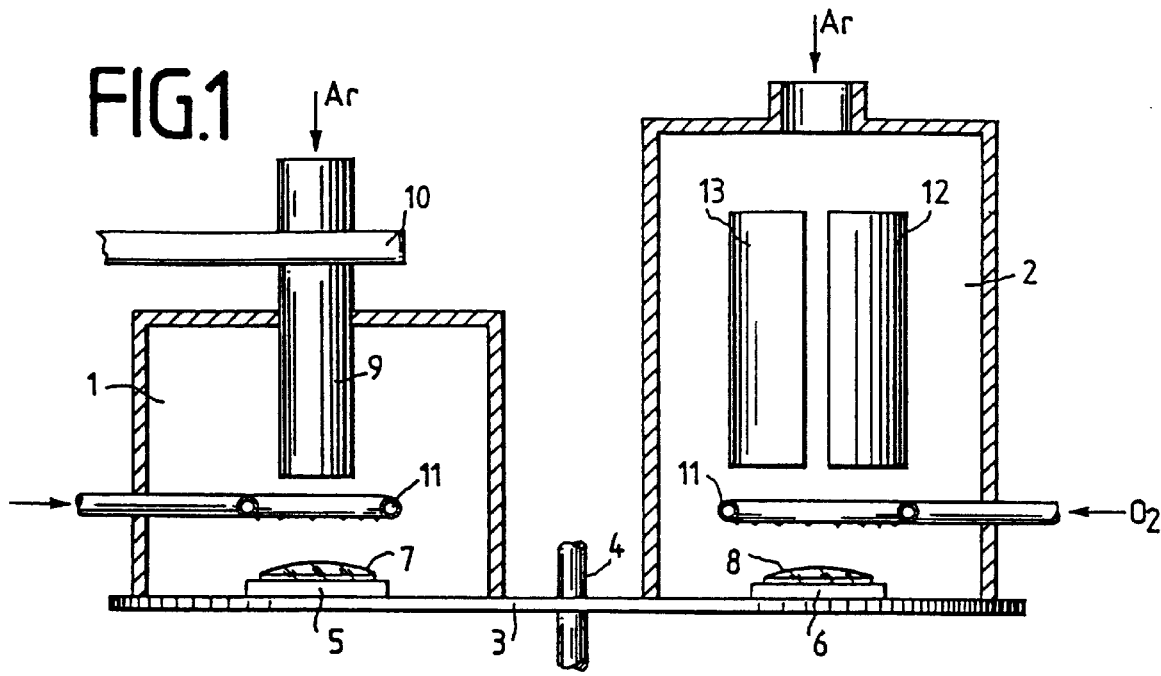
FIG. 1 is a partial cross section through a first embodiment of a coating unit in accordance with the invention.

The present invention will now be described in further detail. FIG. 1 shows, next to one another, a plasma CVD chamber 1 and a gas flow sputter chamber 2. These two chambers are closed along their downwards edge by a transporting device 3 designed as a rotary plate, which rotates around an axle 4 arranged in the middle between the plasma CVD chamber 1 and the gas flow sputter chamber 2. Substrate holders 5, 6 are arranged on the transporting device; they are designed to hold a plastic substrate 7, 8, illustrated here as optical lenses. By rotating the plate 3, the substrate in the first chamber 1 can be moved to the second chamber.

A tube 9, or other conduit, which is conducted through a microwave source 10 outside the plasma CVD chamber 1, is movable from the top into the plasma CVD chamber 1. An annular conduit 11, from which a structure-forming gas, for example, siloxane, flows during the operation of the unit, is located in the plasma CVD chamber 1, below the tube 9. From the top, an excitation gas, for example, argon, $O_2$, $N_2$, $CO_2$, or $N_2O$, is allowed to flow into the plasma CVD chamber 1. This gas forms a plasma through the microwave source 10, reacts in the plasma CVD chamber 1 with the structure-forming gas, and precipitates as the scratch protection layer on the plastic substrate 7. Structure-forming gases are well known in this technology and any suitable one or mixture may be used.

Two tubular sputter electrodes 12, 13 are located in the gas flow sputter chamber 2; they can be connected to the same potential or alternating voltage and together form a closed tube, more or less, through which from the top, a gas, for example, argon, flows to the plastic substrate 8. The two sputter electrodes 12, 13 have, for example, a target made of titanium, which is not shown, so that by the addition of oxygen on the plastic substrate 8, a high-refraction layer made of titanium dioxide is deposited. By turning the transporting device 3 around the axle 4, the plastic substrate 7, for example, can be transferred from the plasma CVD chamber 1 into the gas flow sputter chamber 2. The technology of sputtering is well understood as will be apparent to those skilled in the art and those principles are applicable herein.

Figure 2:
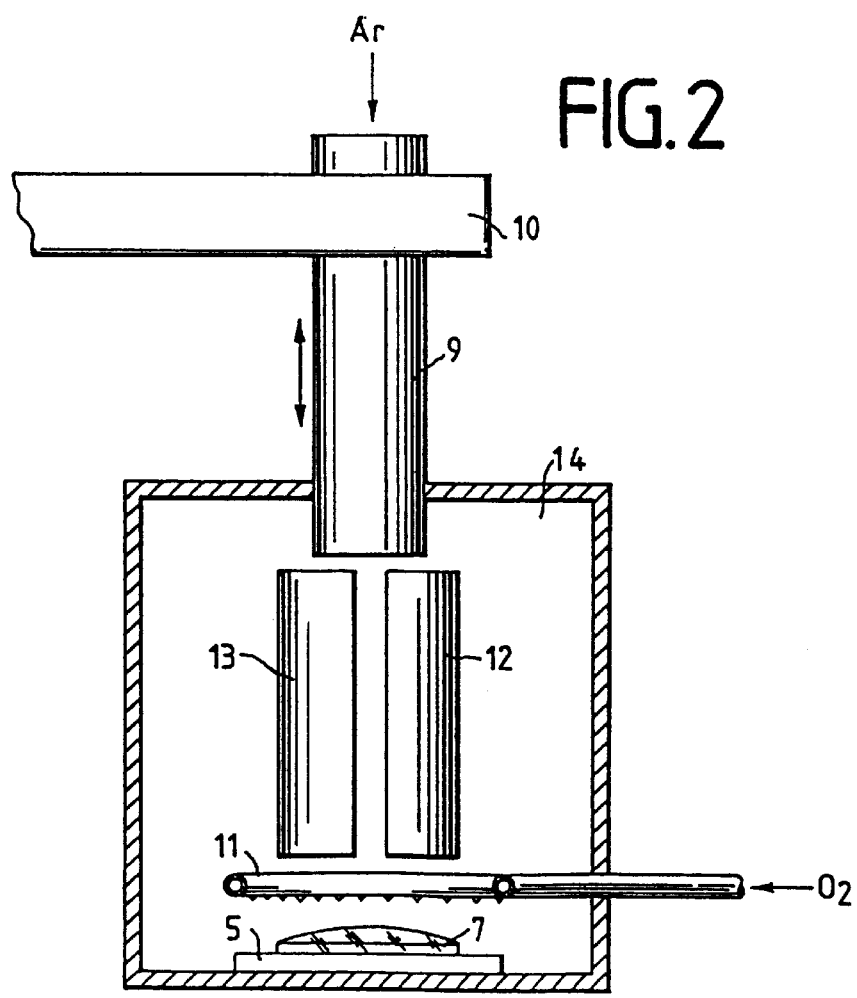
FIG. 2 is a partial cross section through a second embodiment of a coating unit in accordance with the invention.

The embodiment according to FIG. 2 differs from the previously described one, in particular in that only one single vacuum chamber 14 is provided in which, as in the gas flow-sputter chamber 2 in accordance with FIG. 1, once again, two tubular sputter electrodes 12, 13 are located. The tube 9, located in the gas flow sputter 1 in the embodiment according to FIG. 1, is located coaxial to the sputter electrodes 12, 13 in the embodiment according to FIG. 2, and may be moved from the position shown in FIG. 2 so far downwards into the sputter electrodes 12, 13 that the inside jacket surfaces of the sputter electrodes 12, 13 are completely covered by this tube 9.

The sputtering is carried out in the vacuum chamber 14, in the position of the tube 9, shown in FIG. 2, in that the sputter electrodes 12, 13 are supplied with electrical energy, wherein argon flows through the tube 9.

In the preceding creation of the scratch protection layer, the tube 9 was moved far downwards until its lower edge reached the lower edge of the sputter electrodes 12, 13. In this way, the tube 9 protects the sputter electrodes 12, 13 from a coating with the substances forming the scratch protection layer, which would render the sputter electrodes 12, 13 unusable.

Further variations and modification of the foregoing will be apparent to those skilled in the art and are intended to be encompassed by the claims appended hereto.

German application 198 34 314.0 is relied on and incorporated herein by reference.

We claim:

1. A method for an application of a scratch protection layer and an antireflection coating system, said system including at least one high refraction layer, on a plastic substrate, comprising forming a plasma for the formation of the scratch protection layer by plasma CVD, in a vacuum chamber away from said plastic substrate, in an excitation gas, supplying the excitation gas through a tube directed to the plastic substrate, and simultaneously, introducing a structure-forming gas into the vacuum chamber, and for an application of the at least one high refraction layer of the antireflection coating system using a gas flow sputter source.

2. A method for an application of a scratch protection layer and an antireflection coating system, said system including at least one high refraction layer, on a plastic substrate, comprising forming a plasma for the formation of the scratch protection layer by plasma CVD, in a vacuum chamber away from said plastic substrate, in an excitation gas, supplying the excitation gas through a tube directed to the plastic substrate, and simultaneously, introducing a structure-forming gas into the vacuum chamber, and for an application of the at least one high refraction layer of the antireflection coating system using a gas flow sputter source, carrying out the plasma CVD method and the sputtering in a single vacuum chamber, positioning two sputter electrodes, opposite one another and forming two tube areas, in the vacuum chamber as the sputter source, moving the tube supplying the excitation gas downward so as to protect the sputter electrodes from a contamination during the plasma CVD method and then moving the tube upward for carrying out the sputtering.

3. An apparatus for the application of a scratch protection layer and an antireflection coating on a plastic substrate comprising a plasma CVD chamber and a gas flow sputter chamber having a gas flow sputter source, separate from one another, and a transporting device for transporting a plastic substrate from the plasma CVD chamber to the gas flow sputter chamber.

4. The apparatus according to claim 3, wherein the transporting device is a turning plate.

5. An apparatus for the application of a scratch protection layer and an antireflection coating on a plastic substrate comprising a single vacuum chamber, in which two sputter electrodes, forming two tube areas, are located opposite one another, and into which a tube for an excitation gas of a plasma CVD moves, coaxial to said sputter electrodes, and wherein the tube is located so that it can move axially, from a position covering an inside jacket surface of the sputter electrodes, into a position where the electrodes are exposed.

* * * * *